(12) United States Patent
Ishikura et al.

(10) Patent No.: US 11,552,140 B2
(45) Date of Patent: Jan. 10, 2023

(54) TOP EMISSION ORGANIC EL ELEMENT AND MANUFACTURING METHOD THEREOF

(71) Applicant: CANON KABUSHIKI KAISHA, Tokyo (JP)

(72) Inventors: Junri Ishikura, Tokyo (JP); Norihiko Ochi, Kawasaki (JP); Naoari Shibata, Kawaguchi (JP); Masayuki Morohashi, Kawasaki (JP); Shigeki Sasaki, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 16 days.

(21) Appl. No.: 16/891,495

(22) Filed: Jun. 3, 2020

(65) Prior Publication Data

US 2020/0295105 A1 Sep. 17, 2020

Related U.S. Application Data

(63) Continuation of application No. PCT/CT2018/042562, filed on Nov. 16, 2018.

(30) Foreign Application Priority Data

Dec. 5, 2017 (JP) .............................. JP2017-233724

(51) Int. Cl.
*H01L 27/32* (2006.01)
*H01L 51/00* (2006.01)
(Continued)

(52) U.S. Cl.
CPC ...... *H01L 27/3246* (2013.01); *H01L 27/3248* (2013.01); *H01L 27/3258* (2013.01);
(Continued)

(58) Field of Classification Search
None
See application file for complete search history.

(56) References Cited

U.S. PATENT DOCUMENTS 8,203,158 B2   6/2012  Yoshida et al.
8,872,207 B2  10/2014  Jeong et al.
(Continued)

FOREIGN PATENT DOCUMENTS

JP   11-329741 A   11/1999
JP   2011-9017 A    1/2011
(Continued)

*Primary Examiner* — Michelle Mandala
(74) *Attorney, Agent, or Firm* — Venable LLP

(57) ABSTRACT

A top emission organic EL element includes a substrate, an insulating layer including a hole portion, a lower electrode, a light emitting layer, a bank surrounding the lower electrode and the light emitting layer, and an upper transparent electrode. The insulating layer, the lower electrode, the light emitting layer, the bank, and the upper transparent electrode are disposed above the substrate. The bank is arranged on the insulating layer so as to surround the hole portion. The lower electrode is configured to cover an inner side of the hole portion and an area, where the bank is not arranged, of an upper surface of the insulating layer, and a thickness at a center area of the lower electrode is 150 nm or more.

20 Claims, 6 Drawing Sheets

(51) Int. Cl.
*H01L 51/52* (2006.01)
*H01L 51/56* (2006.01)

(52) U.S. Cl.
CPC ...... *H01L 51/0003* (2013.01); *H01L 51/0021* (2013.01); *H01L 51/5234* (2013.01); *H01L 51/56* (2013.01); *H01L 2227/323* (2013.01); *H01L 2251/5315* (2013.01); *H01L 2251/558* (2013.01)

(56) References Cited

U.S. PATENT DOCUMENTS

| | | | |
|---|---|---|---|
| 9,391,304 B2 * | 7/2016 | Lee | H01L 27/3246 |
| 10,347,871 B2 | 7/2019 | Joung et al. | |
| 11,282,906 B2 * | 3/2022 | Tan | H01L 51/5225 |
| 2010/0327297 A1 | 12/2010 | Yoshida et al. | |
| 2013/0168712 A1 | 7/2013 | Jeong et al. | |
| 2015/0001474 A1 | 1/2015 | Park | |
| 2015/0340413 A1 * | 11/2015 | Lee | H01L 27/3246 257/40 |
| 2016/0190217 A1 | 6/2016 | Park et al. | |
| 2017/0155094 A1 | 6/2017 | Joung et al. | |
| 2017/0250362 A1 | 8/2017 | Hiraga | |
| 2019/0280247 A1 | 9/2019 | Joung et al. | |
| 2019/0341430 A1 * | 11/2019 | Lee | H01L 51/0097 |

FOREIGN PATENT DOCUMENTS

| | | |
|---|---|---|
| JP | 2011-60592 A | 3/2011 |
| JP | 2013-140791 A | 7/2013 |
| JP | 2016-1581 A | 1/2016 |
| JP | 2017-103231 A | 6/2017 |
| JP | 2017-157314 A | 9/2017 |

* cited by examiner

TOP EMISSION ORGANIC EL ELEMENT AND MANUFACTURING METHOD THEREOF

CROSS-REFERENCE TO RELATED APPLICATIONS

This application is a Continuation of International Patent Application No. PCT/JP2018/042562, filed Nov. 16, 2018, which claims the benefit of Japanese Patent Application No. 2017-233724, filed Dec. 5, 2017, both of which are hereby incorporated by reference herein in their entirety.

BACKGROUND OF THE INVENTION

Field of the Invention

The present invention relates to a top emission organic EL element and a manufacturing method thereof. Specifically, it relates to a top emission organic EL element including a lower electrode capable of enhancing light extracting efficiency and a manufacturing method thereof.

Description of the Related Art

An organic EL element is an element in which a light emitting layer is formed of a low-molecular organic compound or a high-molecular organic compound having EL light emitting ability, and since it has excellent features as a display element such as a wide viewing angle due to its spontaneous light emitting property and excellent impact resistance, the organic EL element is being actively studied and developed.

As a manufacturing method of organic EL element, a vacuum deposition method, an inkjet method, a printing method, a dispensing method and the like are widely studied. Above all, coating techniques such as the inkjet method and the dispensing method are expected to be a technique suitable for mass production because its system can be downsized as compared to that of the vacuum deposition method and has superior material utilizing efficiency. Generally, in order to manufacture the organic EL element, it is necessary to laminate a number of layers such as an electrode, a light emitting layer, an intermediate layer and the like, and it may be desirable to manufacture as much layers by a liquid-phase coating technique in order to enhance mass productiveness. For example, Japanese Patent Application Laid-Open No. H11-329741 proposes a method of forming, in addition to a light emitting layer, an electrode, a hole transport layer and the like by coating.

While an organic EL element can be classified into a top emission type element where light is extracted above laminated films and a bottom emission type element where light is extracted through a substrate, in the top emission type organic EL element, the lower electrode on the substrate side is required to have high light reflectivity in order to enhance light extracting efficiency.

In a case of manufacturing the lower electrode on the substrate side by liquid-phase coating technique, at first, a region surrounded by a bank is formed on a substrate. Then, a solution in which nanoparticles of copper and/or silver are dispersed is coated on the region surrounded by the bank using an inkjet method, for example, and thereafter, the coating is baked in high temperature.

While a liquid surface is flat or a center area thereof is elevated immediately after coating the solution in which nanoparticles of copper and/or silver are dispersed in the region surrounded by the bank, a flow heading from the center area toward an edge portion is generated during a process in which drying advances. The nanoparticles within the solution move together with the flow toward the edge portion, so that the edge portion of the electrode film is elevated with highly dense nanoparticles, while the center area of the electrode film is thin with a low packing density of nanoparticles. Further, in addition to the influence of the flow in the drying process, a shape of the film being formed or the packing density of particles are influenced by a contact angle of the ink in which the nanoparticles are dispersed to the surface of the bank. In a case where the surface of the bank has high affinity with ink, the solution is likely to be drawn toward the bank and the flow heading toward the edge portion is enhanced further. As a result, the center area of the film tends to have low packing density of nanoparticles and less thickness. Even if the film is baked thereafter, the film quality of the lower electrode reflects the condition during drying, and the center area will have lower density and less thickness compared to the peripheral portion.

In the top emission type element, if the density of the center area of the lower electrode on the substrate side is low and thin, light reflection efficiency of this portion becomes low and the light extracting efficiency as a light emitting element is deteriorated.

There was a demand for a simple technique of manufacturing a top emission organic EL element having a high light extracting efficiency while ensuring a sufficient density and thickness of the lower electrode even near the center area of the region surrounded by the bank.

SUMMARY OF THE INVENTION

A first aspect of the present invention is a top emission organic EL element including a substrate, an insulating layer including a hole portion, a lower electrode, a light emitting layer, a bank surrounding the lower electrode and the light emitting layer, and an upper transparent electrode, wherein the insulating layer, the lower electrode, the light emitting layer, the bank, and the upper transparent electrode are disposed above the substrate. The bank is arranged on the insulating layer so as to surround the hole portion. The lower electrode is configured to cover an inner side of the hole portion and an area, where the bank is not arranged, of an upper surface of the insulating layer, and a thickness at a center area of the lower electrode is 150 nm or more.

A second aspect of the present invention is a top emission organic EL element including a substrate, a lower electrode, a light emitting layer, a bank surrounding the lower electrode and the light emitting layer, and an upper transparent electrode, wherein the lower electrode, the light emitting layer, the bank, and the upper transparent electrode are disposed above the substrate. A thickness of the lower electrode reduces once and increases in an area from a boundary portion with the bank toward a center area.

A third aspect of the present invention is a manufacturing method of a top emission organic EL element including a step of providing an insulating layer including a hole portion above a substrate, a step of forming a bank surrounding the hole portion on the insulating layer, a lower electrode material applying step of applying a solution containing a material of a lower electrode to a region above the substrate surrounded by the bank, a light emitting material applying step of applying a solution containing a material of a light emitting layer to the region above the substrate surrounded by the bank after the lower electrode material applying step, and an upper transparent electrode forming step of forming an upper transparent electrode after the light emitting material applying step.

Further features of the present invention will become apparent from the following description of exemplary embodiments with reference to the attached drawings.

DESCRIPTION OF THE EMBODIMENTS

First Embodiment

Now, a top emission organic EL element, an organic EL device including a plurality of the top emission organic EL elements and a manufacturing method thereof according to a first embodiment of the present disclosure will be described with reference to the drawings.

Configuration of Organic EL Device

Figure 2A:
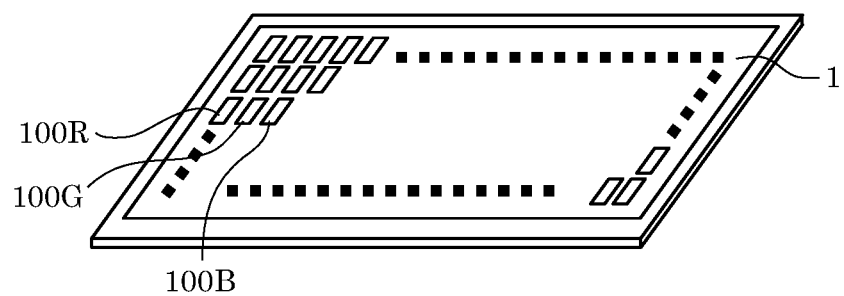
FIG. 2A is a perspective view of an overall organic EL device of the first embodiment.

FIG. 2A is an overall perspective view illustrating a display device as an example of an organic EL device according to the present disclosure.

As illustrated in FIG. 2A, a plurality of organic EL elements 100R, 100G and 100B are arranged in a matrix on a substrate 1. In the case of a display device, each organic EL element functions as a pixel. In this disclosure, pixel refers to a minimum unit capable of controlling a light emitting state.

Figure 2B:
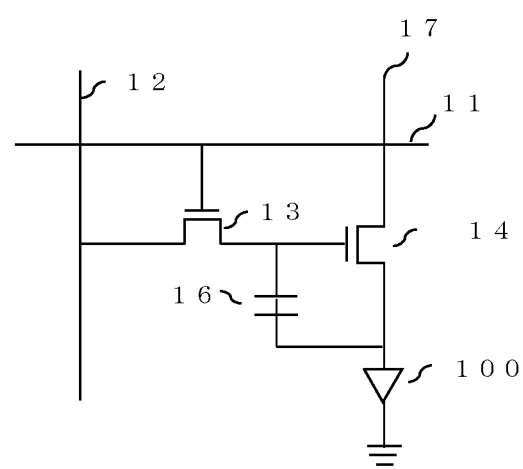
FIG. 2B is an example of a pixel circuit that drives the organic EL element.

The light emitting state of each organic EL element is controlled by a pixel circuit provided to correspond to each organic EL element. An example of a pixel circuit is illustrated in FIG. 2B. The pixel circuit includes a control line 11 for transmitting control signals, a data line 12 for transmitting data signals, a power line 17 through which power supply voltage is supplied, two transistors 13 and 14 and a capacity 16. Control signals entered through a terminal of the organic EL device not shown is transmitted to the control line 11 and data signals entered therethrough are transmitted to the data line 12. The transistor 13 is a switching transistor for retaining voltage according to the data signal in the capacity 16. The transistor 14 is a driving transistor that is electrically connected to a lower electrode 5 of the organic EL element, and it supplies current according to the voltage retained in the capacity 16 to an organic EL element 100.

Multicolor display is enabled, if first organic EL elements 100R, second organic EL elements 100G and third organic EL elements 100B respectively emit light of different colors. In that case, for example, it is preferable for the colors emitted by first, second and third organic EL elements to be red, green and blue or yellow, cyan and white.

Configuration of Organic EL Element

Figure 1A:
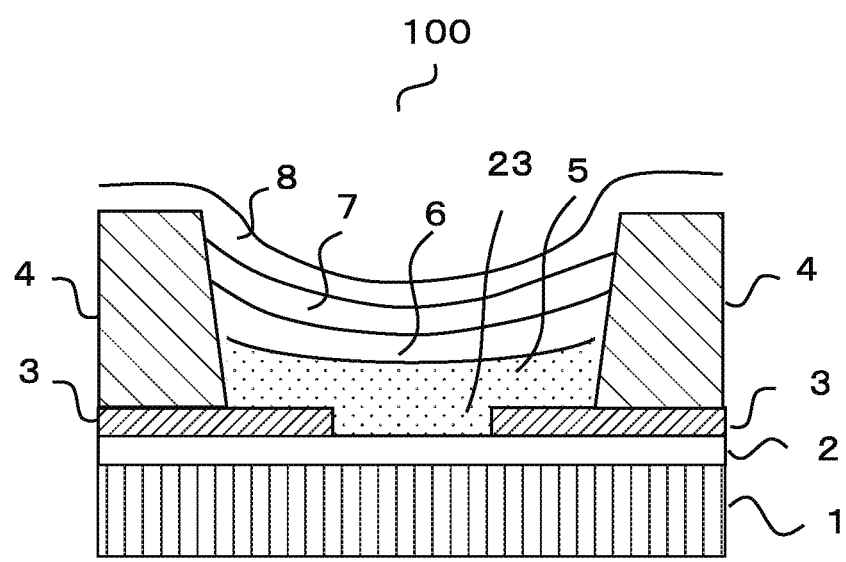
FIG. 1A is a schematic cross-sectional view illustrating a configuration of an organic EL element of a first embodiment.

FIG. 1A is a schematic cross-sectional view illustrating a configuration of the organic EL element according to a preferred embodiment of the present invention.

In FIG. 1A, reference number 100 denotes an organic EL element, 1 denotes a substrate, 2 denotes a first insulating layer, 3 denotes a second insulating layer, 4 denotes a bank, 5 denotes a lower electrode, 6 denotes a light emitting layer, 7 denotes a hole injection layer, 8 denotes an upper transparent electrode, and 23 denotes a hole portion formed on the second insulating layer 3.

A plurality of organic EL elements 100 are arrayed one-dimensionally or two-dimensionally in a case where the organic EL element 100 according to the present embodiment is used as a pixel of a display panel or an element of a plane light source (these will be referred to collectively as a "pixel" in the following description). In such a case, the bank 4 can be formed into a stripe or lattice-shaped pattern corresponding to the array so as to have the bank 4 function as a wall parting the pixels. Further, in a case where there are a plurality of pixels, it is possible to use the upper transparent electrode 8 of each pixel as a common electrode by electrically connecting the upper transparent electrodes 8 of the pixels and forming them into an integrated film.

The organic EL element 100 is provided with a sealing structure not illustrated so as to protect the element from external factors such as moisture and impact. It is possible to use a sealing structure in which a material having low moisture permeability such as glass is adhered using adhesive such as UV curing resin and glass frit. Further, it is also possible to use a sealing structure in which the organic EL element 100 is covered by an inorganic film having low moisture permeability such as SiN and SiO and by laminated films of a resin film and an inorganic film having low moisture permeability. Since the present embodiment adopts a top emission structure, a material having high light transmittance such as glass and SiN is preferably used.

The substrate 1 is a substrate of the organic EL element 100 and is composed of an inorganic material such as glass or an organic material such as resin. The substrate 1 is typically a plate-like member, but the shape thereof is not limited as long as it functions as a substrate, and it may be a deformable film, for example.

The first insulating layer 2 is an insulating layer provided on the substrate 1, and typically, an inorganic insulating material such as $SiO_2$ is used. While FIG. 1A illustrates the first insulating layer 2 as a monolayer for convenience, the first insulating layer 2 may be formed by laminating a plurality of layers, or may be formed using a resin material such as acrylic resin and polyimide resin may be used. A wiring layer or a thin film transistor may be provided between the substrate 1 and the first insulating layer, between a plurality of first insulating layers or on the first insulating layer. The first insulating layer may be provided for various purposes, such as for electrically insulating the wiring layer and the thin film transistor, providing a flat base for upper layers and blocking the component of the substrate 1 or moisture from penetrating the upper layers.

The second insulating layer 3 is an insulating layer provided on the first insulating layer 2, and typically, an organic insulating material such as acrylic resin and polyimide resin is used. The bank 4 is provided above the second insulating layer 3, and the hole portion 23 is formed at the center area of the region surrounded by the bank 4 on the second insulating layer 3.

The bank 4 is a wall provided on the second insulating layer 3, and an insulating material is preferably used as a material of the bank, especially a photosensitive epoxy resin containing fluororesin and resin materials such as acrylic resin and polyimide resin are preferably used. The bank 4 is a structure that electrically separates the light emitting regions, i.e., the pixels, and also functions as a partition that prevents materials from being mixed among pixels while coating liquid-phase materials as described later. Liquid repellency may be applied to the surface of the bank by performing a fluorine plasma treatment or the like.

The lower electrode 5 is one of two poles of the organic EL element and is formed by applying a solution in which nanoparticles of silver and/or copper are dispersed to the region surrounded by the bank, and thereafter baking in high temperature. The lower electrode 5 typically functions as an electron injection layer and also functions as a mirror for enhancing light extracting efficiency by reflecting light heading toward the substrate 1 among light emitted from the light emitting layer 6. The lower electrode 5 is connected to a driving circuit at a region not illustrated. The details of the lower electrode 5 will be described later.

The light emitting layer 6 may be made of any material as long as it has EL light emitting ability and may include a fluorescent organic compound or a phosphorescent organic compound corresponding to a desirable emission color. The light emitting layer 6 may also include a plurality of materials such as a guest material and a host material. The light emitting material includes a high molecular material, a middle molecular material or a low molecular material and is not specifically limited as long as the light emitting material is usable as a coating-type material. For example, a high molecular material such as polyfluorene, a copolymer of polyfluorene and polyphenylene vinylene or a middle molecular material such as oligofluorene may be used. Further, a low molecular material such as condensed polycyclic compound such as fluorene-based, pylene-based, fluoranthene-based and anthracene-based condensed polycyclic compound and metal complex containing iridium may be used.

The hole injection layer 7 is a layer for injecting holes into the light emitting layer 6, and any material may be used for the hole injection layer 7 as long as the material has a hole injection property, and PEDOT:PSS that is widely used for a coating-type organic EL element may be used, but the material is not specifically limited to the PEDOT:PSS.

The upper transparent electrode 8 is another electrode of the organic EL element and is composed of a conductive material having optical transparency such as metal oxide. Typically, the upper transparent electrode 8 supplies holes and functions as a light extraction window. The upper transparent electrode 8 is connected with a driving circuit in a region not illustrated. The upper transparent electrode is formed by vacuum deposition such as sputtering or by coating.

Although the light emitting layer 6 and the hole injection layer 7 are provided as functional layers between the upper transparent electrode 8 and the lower electrode 5 according to the present embodiment, the layer structure of the functional layer is not limited to this example. For example, the layer structure may be a monolayer of only the light emitting layer without providing the hole injection layer, a three-layer structure of hole injection layer/hole transport layer/light emitting layer, a three-layer structure of hole injection layer/light emitting layer/electron transport layer or a four-layer structure of hole injection layer/hole transport layer/light emitting layer/electron transport layer. The functional layers may be laminated inversely from the upper transparent electrode to the lower electrode. There may be a case where the layer other than the light emitting layer within the functional layer is simply called an intermediate layer, and a step of forming these layers is called an intermediate layer material applying step. In a state where voltage is applied to the functional layer from the upper transparent electrode and the lower electrode, holes are injected from an anode and electrons are injected from a cathode to the functional layer, and light is irradiated when the holes and the electrons injected in this manner are recombined in the light emitting layer.

Figure 1B:
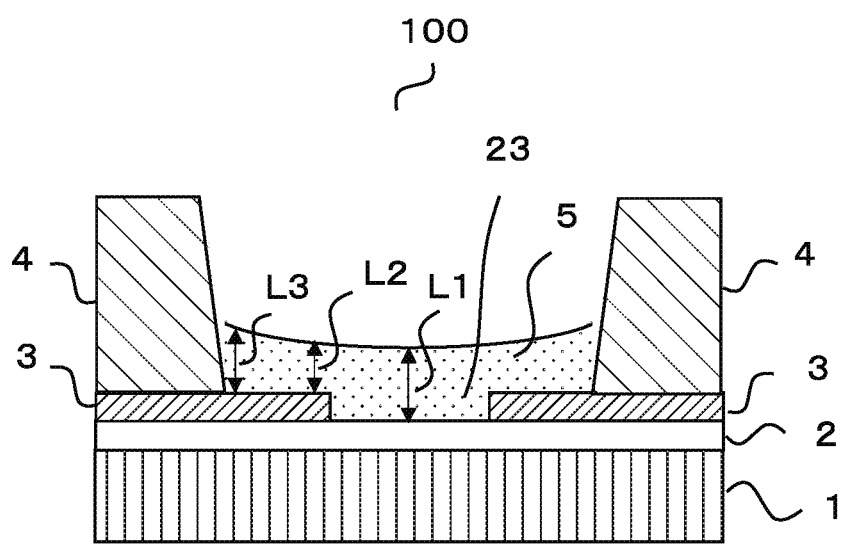
FIG. 1B is a schematic cross-sectional view illustrating a lower electrode of the first embodiment.

Next, a feature of the lower electrode of the present embodiment will be described with reference to FIG. 1B. FIG. 1B is a schematic cross-sectional view illustrating only a part of the organic EL element 100 for convenience. The lower electrode 5 of the present embodiment has a cross-sectional shape in which a part having entered the hole portion 23 of the second insulating layer is set as a bottom. The lower electrode 5 covers an inner side of the hole portion 23 and an upper surface of the second insulating layer 3 where the bank 4 is not disposed.

In a state where the thickness of the lower electrode 5 is set as L1 at the center area, L2 between the center area and the bank 4 and L3 at a boundary portion with the bank 4, L1>L2 and L3>L2 is realized. That is, the thickness of the lower electrode 5 reduces once and increases again from the boundary portion with the bank 4 toward the center area.

The upper surface of the lower electrode 5 is curved upward toward the boundary portion with the bank 4 with the center area set as bottom. The distance between the substrate 1 and the lower surface of the lower electrode 5 is smaller at the center area than at the boundary portion with the bank 4.

Further, the thickness at the center area L1 with respect to the thickness L3 at the boundary portion with the bank 4 of the lower electrode 5, or L1/L3, is 0.75 or higher, and preferably 1.0 or higher, more preferably 1.2 or higher.

According to a typical example of the present embodiment, L1 is 150 nm to 250 nm, L2 is 100 nm and L3 is 200 nm, and the thickness at the center area of the lower electrode is 150 nm or more, the thicknesses at respective areas of the lower electrode are 100 nm or more, with almost no difference in packing density of metallic material between the center area and the peripheral area of the lower electrode.

In a conventional lower electrode, the thickness at the center area tends to be small compared to the thickness of the peripheral area or near the bank and the packing density of the metal material at the center area tends to be deteriorated. As compared thereto, the lower electrode 5 of the present embodiment has a sufficient thickness at the center area with respect to the peripheral area and the packing density of the metal material at the center area is assured to be either equal to or more than that of the peripheral area. Therefore, uniformity of light reflectance is enhanced within the pixel, and an effective value of the light extracting efficiency of the organic EL element is increased. The packing density of the metal material described above can be obtained by observing a cross section of the lower electrode by a SEM image or a STM image and by measuring a ratio of areas of metal and voids contained therein. Further, the light reflectance of the lower electrode can be obtained by vertically inputting light having a same light emitting wavelength as the light emitting layer to an electrode surface and measuring the reflected light in a state where the functional layer and the upper transparent electrode are removed.

Manufacturing Method

Next, a manufacturing method of the organic EL element 100 according to the present embodiment will be described with reference to FIGS. 3A through 3G and FIGS. 4A through 4D.

Figure 3A:
FIG. 3A is a schematic diagram illustrating a manufacturing step of the organic EL element of the first embodiment.

At first, the substrate 1 is prepared as illustrated in FIG. 3A.

Figure 3B:
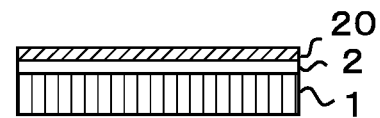
FIG. 3B is a schematic diagram illustrating a manufacturing step of the organic EL element of the first embodiment.

Next, the first insulating layer 2 and an insulating layer 20 not patterned are provided on the substrate 1, as illustrated in FIG. 3B. For example, the first insulating layer is formed of an inorganic material and the insulating layer 20 is formed of a photosensitive resin material.

Figure 3C:
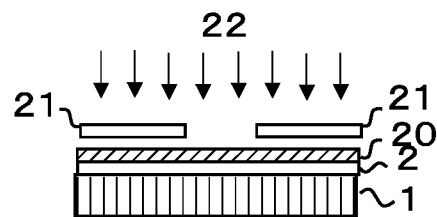
FIG. 3C is a schematic diagram illustrating a manufacturing step of the organic EL element of the first embodiment.

Next, UV light 22 is irradiated through an exposure mask 21 to expose light for patterning the insulating layer 20 as illustrated in FIG. 3C.

Figure 3D:
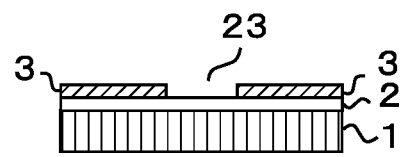
FIG. 3D is a schematic diagram illustrating a manufacturing step of the organic EL element of the first embodiment.

Thereafter, the second insulating layer 3 having the hole portion 23 at the center area is formed by developing the layer using a developer solution as illustrated in FIG. 3D. The second insulating layer can be patterned without eroding the first insulating layer by appropriately selecting materials of the first and second insulating layers and the developer solution.

Figure 3E:
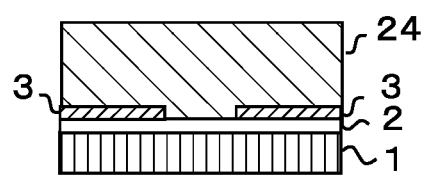
FIG. 3E is a schematic diagram illustrating a manufacturing step of the organic EL element of the first embodiment.

Next, as illustrated in FIG. 3E, an insulating layer 24 not patterned is formed of a photosensitive resin material.

Figure 3F:
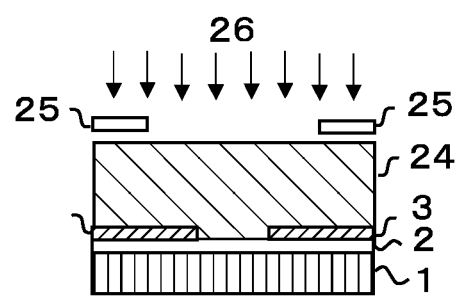
FIG. 3F is a schematic diagram illustrating a manufacturing step of the organic EL element of the first embodiment.

Next, UV light 26 is irradiated through an exposure mask 25 to expose light for patterning the insulating layer 24 as illustrated in FIG. 3F.

Figure 3G:
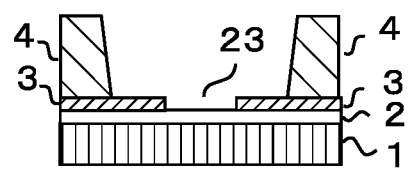
FIG. 3G is a schematic diagram illustrating a manufacturing step of the organic EL element of the first embodiment.

Thereafter, the bank 4 is formed by developing the layer using a developer solution as illustrated in FIG. 3G The bank can be patterned without eroding the first insulating layer and the second insulating layer by appropriately selecting the materials of the first and second insulating layers, the bank and the developer solution. After patterning, a UV ozone treatment or an $O_2$ plasma treatment may be performed to remove residual materials. A fluorine plasma treatment may be performed on the surface of the bank in order to apply liquid repellency.

Figure 4A:
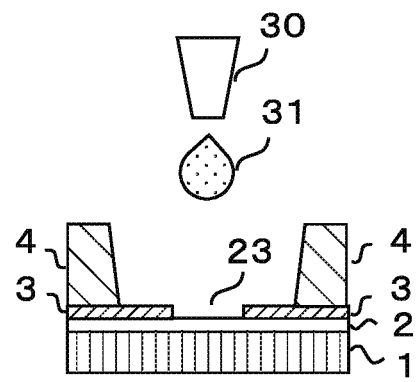
FIG. 4A is a schematic diagram illustrating a manufacturing step of the organic EL element of the first embodiment.
Figure 4B:
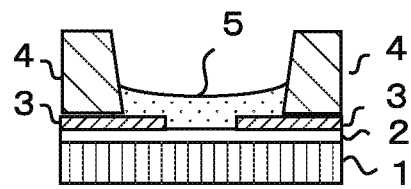
FIG. 4B is a schematic diagram illustrating a manufacturing step of the organic EL element of the first embodiment.

Next, a coating unit 30 is used to coat a solution 31 containing the material of the lower electrode in the region surrounded by the bank as illustrated in FIG. 4A (lower electrode material applying step). While an inkjet unit is preferably used as the coating unit 30, other liquid-phase coating units such as a dispenser may be used. A solution in which silver and/or copper nanoparticles are dispersed may be used as the solution 31. The solution 31 containing the material of the lower electrode is applied so as to coat the hole portion 23 and the upper surface of the region of the second insulating layer 3 where the bank 4 is not disposed. According to the present embodiment, nanoparticles injected to the hole portion are bound in the hole and are not easily attracted even if flow of solution toward the peripheral area occurs. After applying a number of solution droplets as needed, drying and baking is performed in appropriate temperature of 100° C. to 200° C. to form the lower electrode 5 as illustrated in FIG. 4B.

Figure 4C:
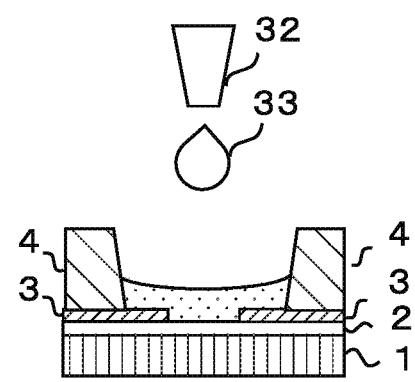
FIG. 4C is a schematic diagram illustrating a manufacturing step of the organic EL element of the first embodiment.
Figure 4D:
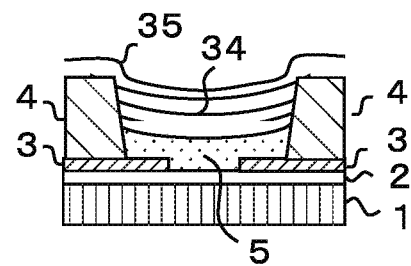
FIG. 4D is a schematic diagram illustrating a manufacturing step of the organic EL element of the first embodiment.

Next, a coating unit 32 is used to coat a solution 33 containing a material of a functional layer 34 in the region surrounded by the bank 4 as illustrated in FIG. 4C. In a case where the light emitting layer and the hole injection layer or the like are sequentially laminated as the functional layers, solutions respectively containing a material of each layer are applied sequentially.

In order to form the light emitting layer, a solution containing a fluorescent organic compound or a phosphorescent organic compound in accordance with a desirable emission color is applied (light emitting material applying step). The light emitting layer may also contain a plurality of materials such as a guest material and a host material. The light emitting material contained in the solution includes a high molecular material, a middle molecular material or a low molecular material and is not specifically limited as long as the light emitting material may be used as a coating type material. For example, the light emitting material may be a high molecular material such as polyfluorene, a copolymer of polyfluorene or polyphenylene vinylene, or a middle molecular material of oligofluorene. Further, the light emitting material may be a low molecular material such as a condensed polycyclic compound such as fluorene-based, pylene-based, fluoranthene-based and anthracene-based compounds and metal complex containing iridium.

For example, in order to form a red-light emitting layer, a red-light emitting layer coating solution containing red phosphorescent emitting iridium metal complex as a guest material and polyfluorene as a host material is used. Further, in order to form a green light emitting layer, a green light emitting layer coating solution containing a fluoranthene-based condensed polycyclic compound as a guest material and polyfluorene as a host material is used. Further, in order to form a blue light emitting layer, a blue light emitting layer coating solution containing a pylene-based condensed polycyclic compound as a guest material and oligofluorene as a host material is used.

In order to form the hole injection layer, the PEDOT/PSS solution which is the hole injecting material for example is applied (hole injection layer forming step).

After completing the formation of the functional layers in this manner, a transparent conductive film 35 is coated to cover the functional layer 34 and the bank 4 by a sputtering process to form the upper transparent electrode (upper transparent electrode forming step).

The organic EL element 100 as illustrated in FIG. 1A is manufactured as described above.

According to the present embodiment, as a result of providing the hole portion on the second insulating layer, fine particles of the electrode material around the center area will not be easily attracted to the peripheral area in manufacturing the organic EL element. This arrangement makes it possible to fully assure the density and the thickness at the center area of the lower electrode and to readily manufacture the top emission organic EL element having a high light extracting efficiency.

Second Embodiment

Now, a top emission organic EL element and a manufacturing method thereof according to a second embodiment of the present disclosure will be described below with reference to the drawings.

Structure of Organic EL Element

Figure 5A:
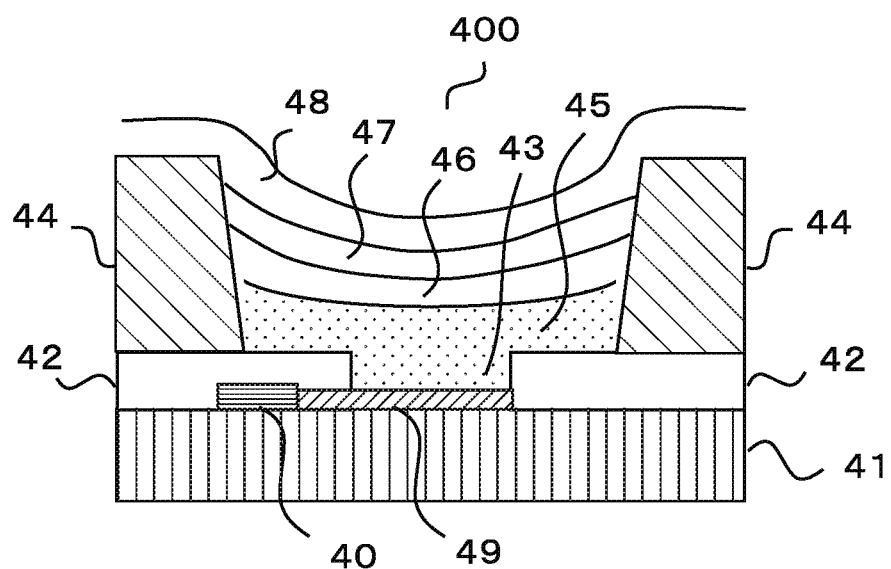
FIG. 5A is a schematic cross-sectional view illustrating a configuration of an organic EL element of a second embodiment.

FIG. 5A is a schematic cross-sectional view illustrating a configuration of an organic EL element according to the second embodiment of the present disclosure functionable as a pixel portion of a display panel or a light emitting portion of an illumination light source.

In FIG. 5A, reference number 400 denotes an organic EL element, 40 denotes a TFT, 41 denotes a substrate, 42 denotes an insulating layer, 43 denotes a hole portion formed on the insulating layer 42, 44 denotes a bank, 45 denotes a lower electrode, 46 denotes a light emitting layer, 47 denotes a hole injection layer, and 48 denotes an upper transparent electrode. Further, 49 denotes a connector electrode that electrically connects the TFT 40 and the lower electrode 45.

A plurality of organic EL elements 400 are arrayed one-dimensionally or two-dimensionally in a case where the organic EL element 400 according to the present embodiment is used as a pixel of a display panel or an element of a surface light source (these will be referred to collectively as a "pixel" in the following description). In such a case, the bank 44 can be formed into a stripe or lattice-shaped pattern corresponding to the array so as to have the bank 44 function as a wall parting the pixels. Further, it is possible to use the upper transparent electrode 48 of each pixel as a common electrode by electrically connecting the upper transparent electrode 48 of each pixel and forming them into an integrated film.

The organic EL element 400 is provided with a sealing structure not illustrated so as to protect the element from external factors such as moisture and impact. It is possible to use a sealing structure in which a material having low moisture permeability such as glass is adhered using adhesive such as UV curing resin and glass frit. Further, it is also possible to use a sealing structure in which the organic EL element 400 is covered by an inorganic film having low moisture permeability such as SiN and SiO and by laminated films of a resin film and an inorganic film having low moisture permeability. Since the present embodiment adopts a top emission structure, a material having high light transmittance such as glass and SiN is preferably used.

The substrate 41 is a substrate of the organic EL element 400 and is composed of an inorganic material such as glass or an organic material such as resin. The substrate 41 is typically a plate-like member, the shape thereof not being limited as long as it functions as a substrate, and for example, it may be a deformable film.

The TFT 40 is a thin film transistor that applies voltage to the lower electrode 45 to drive the pixels.

The insulating layer 42 is an insulating layer that covers the TFT 40 and a part of the connector electrode 49, and the upper surface thereof is flattened. The hole portion 43 is formed at the center are of the insulating layer 42, and the bank 44 is formed on the insulating layer 42 so as to surround the hole portion 43.

The lower electrode 45 is one of two poles of the organic EL element and is formed by applying a solution in which nanoparticles of silver and/or copper are dispersed to the region surrounded by the bank, and thereafter baking in high temperature. The lower electrode 45 typically functions as an electron injection layer and also functions as a mirror for enhancing light extracting efficiency by reflecting light heading toward the substrate 41 among light emitted from the light emitting layer 46. The lower electrode 45 is connected to the connector electrode 49 at a bottom of the hole portion 43. The details of the lower electrode 45 will be described later.

The bank 44, the light emitting layer 46, the hole injection layer 47 and the upper transparent electrode 48 are similar to that of the first embodiment, so that descriptions thereof are omitted. Descriptions of the variation of functional layers between the lower electrode and the upper transparent electrode are similar to the first embodiment, so that they are omitted.

Figure 5B:
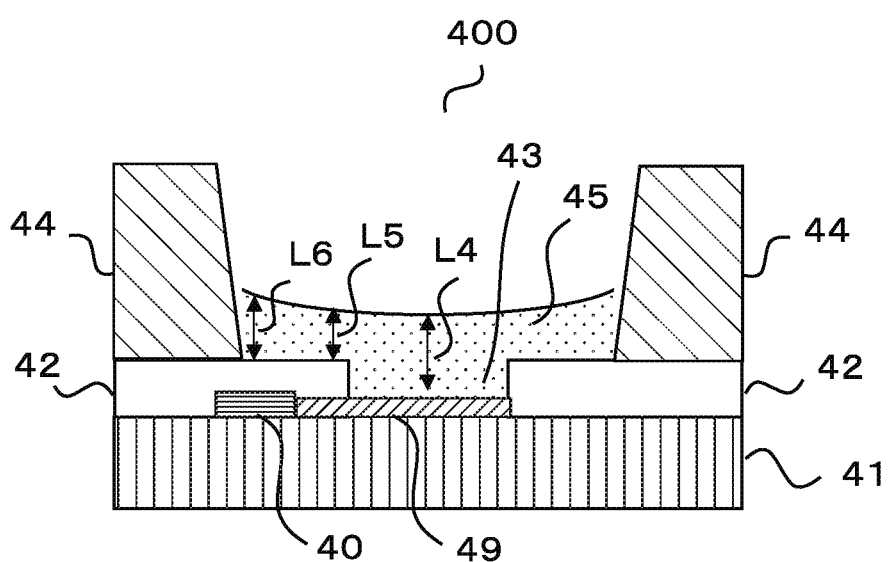
FIG. 5B is a schematic cross-sectional view illustrating a lower electrode of the second embodiment.

Next, a feature of the lower electrode of the present embodiment will be described with reference to FIG. 5B. FIG. 5B is a schematic cross-sectional view illustrating only a part provided on the substrate of the organic EL element 400 for convenience. The lower electrode 45 of the present embodiment has a cross-sectional shape in which a part having entered the hole portion 43 of the insulating layer 42 is set as a bottom. The lower electrode 45 covers an inner side of the hole portion 43 and an upper surface of the insulating layer 42 where the bank 44 is not disposed.

In a state where the thickness of the lower electrode 45 is set as L4 at the center area, L5 between the center area and the bank 44 and L6 at a boundary portion with the bank 44, $L4>L5$ and $L6>L5$ is realized. That is, the thickness of the lower electrode 45 reduces once and increases again from the boundary portion with the bank 44 toward the center area.

The upper surface of the lower electrode 45 is curved upward toward the boundary portion with the bank 44 with the center area set as bottom. The distance between the substrate 41 and the lower surface of the lower electrode 45 is smaller at the center area than at the boundary portion with the bank 44.

Further, the thickness at the center area L4 to the thickness L6 at the boundary portion with the bank 44 of the lower electrode 45, or L4/L6, is 0.75 or higher, and preferably 1.0 or higher, more preferably 1.2 or higher.

According to a typical example of the present embodiment, L4 is 150 nm to 250 nm, L5 is 100 nm and L6 is 200 nm, and the thickness at the center area of the lower electrode is 150 nm or more, the thicknesses at respective areas of the lower electrode are 100 nm or more, with almost no difference in packing density of metallic material between the center area and the peripheral area of the lower electrode.

In a conventional lower electrode, the thickness at the center area tends to be small compared to the peripheral area or near the bank and the packing density of the metal material tends to be deteriorated. As compared thereto, the lower electrode 45 of the present embodiment has a sufficient thickness at the center area with respect to the peripheral area and the packing density of the metal material at the center area is assured to be either equal to or more than that of the peripheral area. Therefore, uniformity of light reflectance is enhanced within the pixel, and an effective value of the light extracting efficiency of the organic EL element is increased. The packing density of the metal material described above may be obtained by observing a cross section of the lower electrode by a SEM image or a STM image and by measuring a ratio of areas of metal and voids contained therein. Further, the light reflectance of the lower electrode can be obtained by vertically inputting light having a same light emitting wavelength as the light emitting layer to an electrode surface and measuring the reflected light in a state where the functional layer and the upper transparent electrode are removed.

Manufacturing Method

A manufacturing method of the organic EL element 400 according to the present embodiment differs from that of the first embodiment in that the TFT 40 serving as a driving transistor and the connector electrode 49 are provided in advance on the substrate 41 and the insulating layer 42 having the hole portion 43 is formed to cover the surface. A manufacturing method of the insulating layer 42 of the present embodiment is roughly the same as the manufacturing method of the second insulating layer 3 according to the first embodiment. The manufacturing methods of the bank 44, the functional layer and the upper transparent electrode are similar to those of the first embodiment, so that their descriptions will be omitted.

According to the present embodiment, as a result of providing the hole on the insulating layer 42, the fine particles of electrode material around the center area are bound within the hole and not easily attracted to the peripheral area during manufacturing. This arrangement enables to realize sufficient density and thickness of the lower electrode at the center area and to manufacture the top emission organic EL element having a high light extracting efficiency easily.

First Example

A specific example of the lower electrode of the first embodiment will be described. A size of an opening of the hole portion 23 of the second insulating layer 3 is set to 1/10 the size of the element area, and a depth of the hole portion is approximately the same as a thickness of the second insulating layer. Polysiloxane is used as the material of the second insulating layer 3. Ink repellent treatment is performed on the side surface of the bank 4 so that it has a contact angle of 60 to 70° to a silver nanoparticle dispersed ink (manufactured by Daiken Chemical Co., Ltd. NAG series). Silver nanoparticle dispersed ink (Daiken Chemical Co., Ltd. NAG series) having undecane as a main solvent, an average particle diameter of 10 nm and a solid fraction of 50 wt % is coated on the above-described substrate by an inkjet method to form the lower electrode 5. A first droplet of 1 pl was filled in the hole portion 23 at the center area, and then nine droplets of 1 pl were coated within the region surrounded by the bank, which were dried and baked thereafter.

The thicknesses of the respective parts of the lower electrode were 200 nm at L1, 100 nm at L2 and 200 nm at L3. That is, the thickness at the center area of the lower electrode was 200 nm, and the thicknesses at the respective parts were 100 nm or more. Further, the packing density of the electrode material at the center area and at the peripheral area of the lower electrode were both 80% of a bulk material and were equal.

When reflectance was measured by inputting a beam having a same emission wavelength as the light emitting layer vertically into the electrode surface, the reflectance at the center area and at the peripheral area of the example were both 90% based on the reflectance of the flat surface of the bulk material.

Second Example

A specific example of the lower electrode according to the second embodiment will be described. As illustrated in FIG. 4B, an insulating layer having a contact hole to be electrically connected to the TFT 40 provided thereto is formed at a center area surrounded by the bank 44. An insulating layer is formed on a glass substrate to which the TFT 40 and the connector electrode 49 have been formed, and the hole portion 43 is formed at the center area by photolithography. An opening size of the hole portion 43 is 1/10 the size of the element area, and a depth of the contact hole is 200 nm, which is equal to the thickness of the insulating layer 42. Ink repellent treatment is performed on the side surface of the bank 44 so that it has a contact angle of 60 to 70° to a silver nanoparticle dispersed ink (manufactured by Daiken Chemical Co., Ltd. NAG series). Silver nanoparticle dispersed ink (Daiken Chemical Co., Ltd. NAG series) having undecane as a main solvent, an average particle diameter of 10 nm and a solid fraction of 50 wt % is coated on the above-described substrate by an inkjet method to fill the inside of the contact hole and thereby form the lower electrode 45. A first droplet of 1 pl was filled in the hole portion 43 at the center area, and then nine droplets of 1 pl were coated within the region surrounded by the bank, which were dried and baked thereafter.

The thicknesses of the respective parts of the lower electrode were 200 nm at L4, 100 nm at L5 and 200 nm at L6. That is, the thickness at the center area of the lower electrode was 200 nm, and the thicknesses at the respective parts were 100 nm or more. Further, the packing density of the electrode material at the center area and at the peripheral area of the lower electrode were both 80% of a bulk material and were equal.

When reflectance was measured by inputting a beam having a same emission wavelength as the light emitting layer vertically into the electrode surface, the reflectance at the center area and at the peripheral area of the example were both 90% based on the reflectance of the flat surface of the bulk material.

First Comparative Example

Figure 6:
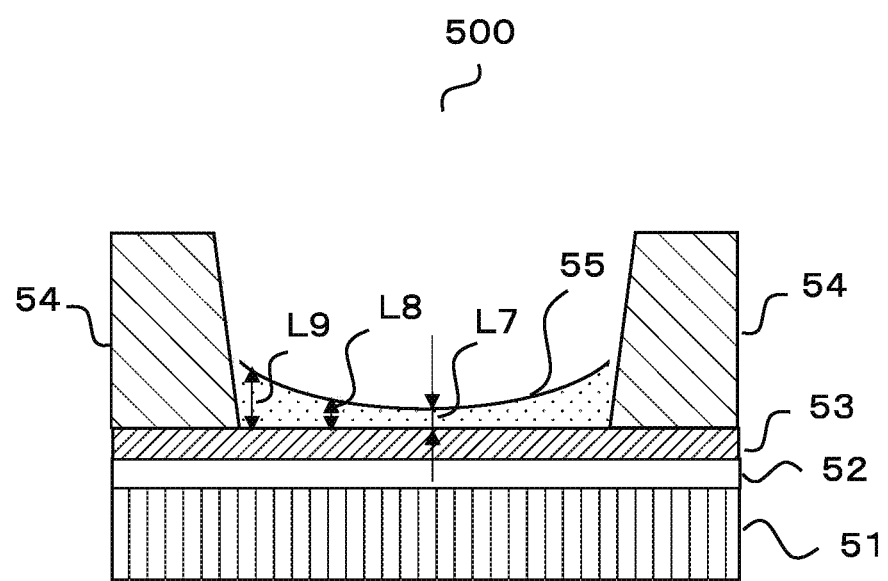
FIG. 6 is a schematic cross-sectional view illustrating a lower electrode of a comparative example.

As illustrated in FIG. 6, a lower electrode 55 is formed on an insulating layer having a flat upper surface and not having a hole portion formed thereto. The structure has a planarizing layer 53 and a bank 54 provided on a glass substrate, and ink repellent treatment is performed on the side surface of the bank 54 so that it has a contact angle of 60 to 70° to a silver nanoparticle dispersed ink. In order to compare with the other examples, the present comparative example does not have a hole portion provided on the planarizing layer 53 to the region surrounded by the bank 54. Similar to first and second examples, silver nanoparticle dispersed ink (Daiken Chemical Co., Ltd. NAG series) having undecane as a main solvent, an average particle diameter of 10 nm and a solid fraction of 50 wt % was coated for a total of 10 droplets of 1 pl, which was dried and baked thereafter to form the lower electrode 55.

The thicknesses of the respective parts of the lower electrode were 50 nm at L7, 100 nm at L8 and 400 nm at L9. That is, the thickness at the center area of the lower electrode was 50 nm, and the minimum thickness at the respective parts was 50 nm. Further, the packing density of the electrode material at the peripheral area of the lower electrode was 80% of a bulk material, whereas the packing density at the center area thereof was only 30%.

When reflectance was measured by inputting a beam having a same emission wavelength as the light emitting layer vertically into the electrode surface, the reflectance at the peripheral area of the comparative example was 90% based on the reflectance of the flat surface of the bulk material, whereas the reflectance at the center area of the comparative example was only 50%.

Result of Examples and Comparative Example

As described above, it can be seen that the difference between the film thickness of the center area and of the peripheral area is small and the difference between the packing density of the center area and of the peripheral area is small in the lower electrodes of the first and second examples as compared to those of the comparative example. As a result, the lower electrodes of the first and second examples exhibited high reflectance not only at the peripheral area but also at the center area. When the functional layers and the upper transparent electrode were formed on the lower electrode of the examples and the comparative example to form the organic EL elements, it was confirmed that the elements of the two examples achieved high luminance with less input power as compared to the element of the comparative example.

Other Embodiment

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A top emission organic EL element comprising:
a substrate;
an upper transparent electrode above the substrate;
a lower electrode between the upper transparent electrode and the substrate;
a light emitting layer having a light emitting region between the upper transparent electrode and the lower electrode; and
a bank surrounding the light emitting region of the light emitting layer,
wherein the lower electrode includes, under the light emitting region of the light emitting layer, a first part, a second part and a third part, the second part being between the first part and the third part, and the third part being closer to the bank than the first part,
wherein a thickness (L2) of the second part of the lower electrode is less than a thickness (L1) of the first part of the lower electrode and a thickness (L3) of the third part of the lower electrode,
wherein an upper surface of the lower electrode is curved upward from the first part toward the third part via the second part, and
wherein a lower surface of the lower electrode has such a shape that a difference between a distance from the substrate to the second part and a distance from the substrate to the third part is smaller than a difference between the thickness (L2) of the second part of the lower electrode and the thickness (L3) of the third part of the lower electrode.

2. The top emission organic EL element according to claim 1, wherein
the thickness (L1) of the first part of the lower electrode is 150 nm or more.

3. The top emission organic EL element according to claim 1, wherein the thickness (L1) of the first part of the lower electrode is more than the thickness (L3) of the third part of the lower electrode.

4. The top emission organic EL element according to claim 1, wherein the lower surface of the lower electrode has such a shape that a distance from the substrate to the first part is smaller than a distance from the substrate to the second part.

5. The top emission organic EL element according to claim 1, wherein the thickness (L1) of the first part of the lower electrode is 250 nm or less.

6. The top emission organic EL element according to claim 1, further comprising an insulating layer between the lower electrode and the substrate,
wherein the insulating layer has a hole portion, and the lower electrode covers an inner side of the hole portion and an upper surface of the insulating layer.

7. The top emission organic EL element according to claim 1, wherein the thickness (L1)/the thickness (L3) is 0.75 or higher.

8. The top emission organic EL element according to claim 7, wherein the thickness (L1)/the thickness (L3) is 1.0 or higher.

9. The top emission organic EL element according to claim 7, wherein the thickness (L1)/the thickness (L3) is 1.2 or higher.

10. The top emission organic EL element according to claim 6, further comprising:
a connector electrode arranged between the insulating layer and the substrate; and
a transistor on the substrate,
wherein the lower electrode is electrically connected to the transistor via the connector electrode, and the insulating layer is configured to cover the transistor.

11. The top emission organic EL element according to claim 1, further comprising an intermediate layer between the lower electrode and the upper transparent electrode,
wherein the first part and the second part are in contact with the intermediate layer of the light emitting layer.

12. The top emission organic EL element according to claim 11, wherein the intermediate layer comprises a hole injection layer, and the hole injection layer does not have any portion arranged between the bank and the lower electrode.

13. A top emission organic EL device comprising a plurality of top emission organic EL elements, each of which is the top emission organic EL element according to claim 12, wherein upper transparent electrodes of the plurality of top emission organic EL elements are electrically connected to each other.

14. A top emission organic EL device comprising:
a first plurality of organic EL elements, each of which emits a first emission color; and
a second plurality of organic EL elements, each of which emits a second emission color different from the first color, wherein each of the first plurality of organic EL elements includes the top emission organic EL element according to claim 5.

15. A top emission organic EL device comprising a plurality of top emission organic EL elements, each of which is the top emission organic EL element according to claim 1, wherein upper transparent electrodes of the plurality of top emission organic EL elements are electrically connected to each other.

16. A top emission organic EL device comprising:
- a first plurality of organic EL elements, each of which emits a first emission color; and
- a second plurality of organic EL elements, each of which emits a second emission color different from the first color, wherein each of the first plurality of organic EL elements includes the top emission organic EL element according to claim 1.

17. The top emission organic EL element according to claim 10, wherein the first part is in contact with the connector electrode.

18. The top emission organic EL element according to claim 1, wherein the lower electrode is in contact with a side surface of the bank.

19. The top emission organic EL element according to claim 1, further comprising an insulating layer between the lower electrode and the substrate, wherein the insulating layer has a hole portion under the light emitting region of the light emitting layer, the first part of the lower electrode includes a portion in the hole portion, and the second part and the third part are between the insulating layer and the light emitting region of the light emitting layer.

20. The top emission organic EL element according to claim 1, wherein the lower electrode is made of a metal material.

\* \* \* \* \*